(12) United States Patent
Iijima et al.

(10) Patent No.: US 11,167,379 B2
(45) Date of Patent: Nov. 9, 2021

(54) SOLDER ALLOY, SOLDER BALL, SOLDER PREFORM, SOLDER PASTE AND SOLDER JOINT

(71) Applicant: SENJU METAL INDUSTRY CO., LTD., Tokyo (JP)

(72) Inventors: Yuki Iijima, Tokyo (JP); Hikaru Nomura, Tokyo (JP); Takashi Saito, Tokyo (JP); Naoko Izumita, Tokyo (JP); Shunsaku Yoshikawa, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/830,024

(22) Filed: Mar. 25, 2020

(65) Prior Publication Data
US 2020/0306895 A1 Oct. 1, 2020

(30) Foreign Application Priority Data

Mar. 27, 2019 (JP) .............................. JP2019-060504

(51) Int. Cl.
| | | |
|---|---|---|
| C22C 13/00 | (2006.01) | |
| B23K 35/30 | (2006.01) | |
| B23K 35/02 | (2006.01) | |
| B23K 103/08 | (2006.01) | |
| B23K 35/26 | (2006.01) | |
| C22C 13/02 | (2006.01) | |

(52) U.S. Cl.
CPC ........ B23K 35/3006 (2013.01); B23K 35/025 (2013.01); B23K 35/26 (2013.01); B23K 35/262 (2013.01); B23K 35/264 (2013.01); B23K 2103/08 (2018.08); C22C 13/00 (2013.01); C22C 13/02 (2013.01)

(58) Field of Classification Search
CPC .................................................. B23K 35/262
See application file for complete search history.

(56) References Cited

U.S. PATENT DOCUMENTS

| 10,717,158 B2 * | 7/2020 | Saito .................. C22C 13/00 |
| 2016/0056570 A1 | 2/2016 | Yoshikawa et al. |
| 2016/0279741 A1 | 9/2016 | Ukyo et al. |
| 2017/0355043 A1 | 12/2017 | Ikeda et al. |
| 2018/0029169 A1 | 2/2018 | Arai et al. |
| 2018/0361519 A1 | 12/2018 | Tachibana et al. |
| 2019/0001443 A1 * | 1/2019 | Saito .................. B23K 1/19 |

FOREIGN PATENT DOCUMENTS

| EP | 2875898 A1 | 5/2015 | |
|---|---|---|---|
| EP | 3235587 A1 | 10/2017 | |
| EP | 3321025 A1 | 5/2018 | |
| EP | 3326745 A1 | 5/2018 | |
| EP | 3381601 A1 | 10/2018 | |
| EP | 3603877 A1 | 2/2020 | |
| JP | 5723056 B1 | 5/2015 | |
| JP | 2016-047555 A | 4/2016 | |
| JP | 2016-113665 A | 6/2016 | |
| JP | 2016-179498 A | 10/2016 | |
| JP | 2017-170464 A | 9/2017 | |
| JP | 6200534 B2 | 9/2017 | |
| JP | 2018-001179 A | 1/2018 | |
| JP | 2018-043265 A | 3/2018 | |
| JP | 6370458 B1 | 8/2018 | |
| JP | 2018-167310 A | 11/2018 | |
| WO | WO-2014/163167 A1 | 10/2014 | |
| WO | WO-2018034320 A1 * | 2/2018 | ............. B23K 35/26 |
| WO | WO-2018/181873 A1 | 10/2018 | |

OTHER PUBLICATIONS

English machine translation of JP 2018-001179 A of Arai published Jan. 11, 2018 (Year: 2018).*
Japanese Office Action dated Jul. 30, 2019 for the corresponding Japanese Patent Application No. 2019-060504.
Extended European Search Report dated Jun. 30, 2020 for the corresponding European Patent Application No. 20166279.8.
Application for Cancellation dated Feb. 2, 2021 for the corresponding Korean Patent Application No. 4-2012-054516-0.
Third Party Observation dated Feb. 17, 2021 for the corresponding European Patent Application No. 20166279.8.
Chinese Office Action dated Jul. 30, 2021 for the corresponding Chinese Patent Application No. 202010217346.
"Lead-Free Solder", *Chinese Standards Press*, May 31, 2018.

* cited by examiner

*Primary Examiner* — Jophy S. Koshy
(74) *Attorney, Agent, or Firm* — Leason Ellis LLP

(57) ABSTRACT

A solder alloy has an alloy composition consisting of, in mass %, Ag: from 3.2 to 3.8%, Cu: from 0.6 to 0.8%, Ni: from 0.01 to 0.2%, Sb: from 2 to 5.5%, Bi: from 1.5 to 5.5%, Co: from 0.001 to 0.1%, Ge: from 0.001 to 0.1%, and optionally at least one of Mg, Ti, Cr, Mn, Fe, Ga, Zr, Nb, Pd, Pt, Au, La and Ce: 0.1% or less in total, with the balance being Sn. The alloy composition satisfies the following relationship (1): $2.93 \leq \{(Ge/Sn)+(Bi/Ge)\} \times (Bi/Sn)$ (1). In the relationship (1), each of Sn, Ge, and Bi represents the content (mass %) in the alloy composition.

13 Claims, 2 Drawing Sheets

SOLDER ALLOY, SOLDER BALL, SOLDER PREFORM, SOLDER PASTE AND SOLDER JOINT

CROSS-REFERENCE TO RELATED APPLICATIONS

This application claims the benefit of priority to Japanese Patent Application No. 2019-60504 filed on Mar. 27, 2019, the entire subject matter of which is incorporated herein by reference.

FIELD OF THE INVENTION

The present invention relates to a solder alloy, a solder ball, a solder preform, a solder paste and a solder joint, each ensuring that no missing occurs, excellent wet spreading is exhibited, the growth of an intermetallic compound after soldering is inhibited, and the fracture mode after a shear strength test is appropriate.

BACKGROUND OF THE INVENTION

With recent progress in car electronics, automobiles are shifting from gasoline vehicles to hybrid vehicles or electric vehicles. In hybrid vehicles or electric vehicles, an in-vehicle electronic circuit in which electronic components are soldered to a printed circuit board is mounted. The in-vehicle electronic circuit has been disposed in a vehicle cabin being subjected to a relatively moderate vibration environment. However, along with the expansion of its application, it has come to be mounted in an engine room or an oil chamber of a transmission or even directly on a mechanical device.

As described above, the in-vehicle electronic circuit is mounted in a location being subject to various external loads, such as temperature difference, impact and vibration, due to enlargement of the mounting area. For example, an in-vehicle electronic circuit mounted in an engine room may be exposed to a high temperature of 125° C. or more during engine operation. On the other hand, when the engine is stopped, it is exposed to a low temperature of −40° C. or less in a cold district.

Conventionally, an Sn—Ag—Cu solder alloy has been widely used as an alloy for connecting a substrate and an electronic component. The solder alloy is increasingly expanding its range of application, and therefore, uses in a harsh environment typified by automotive applications have been desired. At the same time, the solder alloy is required to ensure high connection reliability such that no breakage or degradation in the solder joint occurs even when the solder joint is used for a long time in such an environment.

However, when an electronic circuit is exposed to the temperature difference described above, a stress is concentrated on the joint portion due to a difference in the coefficient of thermal expansion between an electronic component and a printed circuit board. Therefore, use of a conventional Sn-3 Ag-0.5 Cu solder alloy may cause breakage of a joint portion, and a solder alloy that prevents breakage of a joint portion even in an environment subject to a large temperature difference is desired.

For example, Japanese Patent No. 6200534 discloses an alloy composition in which Ge can be contained as an optional element in an Sn—Ag—Cu—Ni—Sb—Co-based solder alloy. This literature also states that in a case where the Cu content is 0.5 mass %, an effect of preventing Cu-leaching with respect to the Cu land is exerted, the viscosity of the solder alloy in melting is kept in a good state, the generation of voids during reflow is reduced, and the thermal shock resistance of the solder joint portion formed is enhanced.

JP-A-2017-170464 discloses an alloy composition in which Co or Ge is contained as an optional element in an Sn—Ag—Cu—Ni—Sb—Bi-based solder alloy. This literature also states that in a case where the Ag content is set within a range of 1 to 3.1 mass %, in addition to preventing the development of cracking of the solder joint portion in a harsh environment having a large temperature difference, an $Ag_3Sn$ compound is deposited in the Sn grain boundary of the solder alloy to impart mechanical strength.

Japanese Patent No. 5723056 discloses an alloy composition in which at least one of Ni, In, Ga, Ge and P can be contained as an optional element in an Sn—Ag—Cu—Sb—Bi—Co-based solder alloy that is a solder alloy having excellent heat cycle characteristics. In Example 24 of this literature, Sn-3.5 Ag-0.7 Cu-5.0 Bi-5.0 Sb-0.005 Co-0.1 Ni-0.1 In-0.1 Ga-0.1 Ge-0.1 P is discussed as a specific alloy composition.

The solder alloy described in Japanese Patent No. 6200534 is supposed to be capable of exerting an effect of preventing Cu leaching, reducing the generation of voids, and enhancing the thermal shock resistance, as described above. However, these effects are exerted only in a case where the Cu content is 0.5 mass %, and if the Cu content even slightly deviates from 0.5 mass %, the effects cannot be exerted. Accordingly, it is obvious that the versatility is extremely low and further studies are necessary.

In addition, Bi typically forms a solid solution with Sn to some extent and therefore, in a case where the solder alloy contains Bi, diffusion of Cu into Sn is prevented. Since the solder alloy described in Japanese Patent No. 6200534 does not contain Bi, it is considered that Cu of the electrode diffuses into Sn and an intermetallic compound layer is easily formed at the bonding interface.

In the solder alloy described in JP-A-2017-170464, it is said that, as described above, the Ag content is within a predetermined range and the mechanical strength of the solder alloy is thereby imparted. However, in a case where the mechanical strength of the solder alloy is enhanced, the stress applied to the solder joint is concentrated on the bonding interface, and breakage is likely to occur at the bonding interface of the solder joint. As a result, the solder joint may exhibit a fracture mode that should be most avoided. In addition, Ag can enhance the wettability of the solder alloy and therefore, it is considered that Ag needs to be contained in a certain amount.

The solder alloy described in Japanese Patent No. 5723056 contains In and, consequently, wettability is lowered, leaving a fear that the solder joint may be broken in the vicinity of the bonding interface when a stress is applied to the solder joint.

Furthermore, in Japanese Patent No. 6200534, JP-A-2017-170464, Japanese Patent No. 5723056, as described above, heat cycle characteristics are mainly focused on to design alloys. However, in recent years, miniaturization of electronic components such as CPU (Central Processing Unit) is required and in turn, the electrode must be reduced in size. A microminiature electrode faces the so-called problem of the occurrence of the missing, which is a phenomenon that soldering is not achieved after reflow, depending on the shape and properties of the solder alloy, regardless of whether the form is a solder ball, a solder preform or a solder paste.

In this way, while an alloy design made by focusing on heat cycle characteristics has been conventionally made, a solder alloy capable of simultaneously solving the above-described problems including missing is demanded so as to cope with the recent miniaturization trend of electronic components.

Accordingly, an object of the present invention is to provide a solder alloy, a solder ball, a solder preform, a solder paste and a solder joint, each ensuring that no missing occurs, excellent wet spreading is exhibited, the growth of an intermetallic compound at the bonding interface after soldering is inhibited, and the fracture mode after a shear strength test is appropriate.

The present inventors focused on, in the solder alloy described in Japanese Patent No. 6200534, an alloy composition containing Bi so as to inhibit the growth of an intermetallic compound while the Cu content is within a predetermined range. In addition, the present inventors focused on, in the solder alloy described in JP-A-2017-170464, an alloy composition in which the Ag content is adjusted in an appropriate range so as to prevent a stress from being concentrated on the bonding interface and at the same time, enhance the wettability. Furthermore, the present inventors focused on, in the solder alloy described in Japanese Patent No. 5723056, an alloy composition containing no In so as to improve the wettability/spreadability and shift the fracture portion after a shear strength test from the bonding interface toward the solder alloy side.

Although the problems with the conventional alloy compositions have been solved to some extent, it has been found that the missing occurs for one or more samples in 5 samples. Then, the present inventors have conducted detailed studies for preventing the missing while excellent wettability, inhibition of the growth of an intermetallic compound, and optimization of the fracture mode are maintained.

The present inventors have thought that in a case where the surface of a solder alloy is modified into a dense structure, the missing can be prevented, and they have made investigations in detail regarding constituent elements so as to obtain a dense structure. As a result, it has been accidentally found that in a case where the pairs of Bi and Ge, Sn and Ge, and Sn and Bi satisfy a predetermined relationship, the missing can be prevented. It has also been found that in a case where all of the constituent elements fall within respective predetermined ranges and satisfy the relationship described above, prevention of the missing, excellent wettability/spreadability, inhibition of the growth of an intermetallic compound at the bonding interface, and optimization of the fracture mode after a shear strength test can be achieved at the same time. Thus, the present invention has been accomplished.

SUMMARY OF THE INVENTION

The present invention obtained based on these findings is as follows.

(1) A solder alloy having an alloy composition consisting of, in mass %, Ag: from 3.2 to 3.8%, Cu: from 0.6 to 0.8%, Ni: from 0.01 to 0.2%, Sb: from 2 to 5.5%, Bi: from 1.5 to 5.5%, Co: from 0.001 to 0.1%, Ge: from 0.001 to 0.1%, and optionally at least one of Mg, Ti, Cr, Mn, Fe, Ga, Zr, Nb, Pd, Pt, Au, La and Ce: 0.1% or less in total, with the balance being Sn, in which the alloy composition satisfies the following relationship (1):

$$2.93 \leq \{(Ge/Sn)+(Bi/Ge)\} \times (Bi/Sn) \qquad (1)$$

In the relationship (1), each of Sn, Ge, and Bi represents the content (mass %) in the alloy composition.

(2) The solder alloy according to (1), in which the alloy composition consists of, in mass %, Ag: from 3.2 to 3.8%, Cu: from 0.6 to 0.8%, Ni: from 0.01 to 0.2%, Sb: from 2 to 5.5%, Bi: from 1.5 to 5.5%, Co: from 0.001 to 0.1%, Ge: from 0.001 to 0.1%, and at least one of Mg, Ti, Cr, Mn, Fe, Ga, Zr, Nb, Pd, Pt, Au, La and Ce: 0.1% or less in total.

(3) The solder alloy according to (1) or (2), in which the alloy composition further satisfies the following relationship (2):

$$0.001 < (Ni/Co) \times (1/Ag) \times Ge < 0.15 \qquad (2)$$

In the relationship (2), each of Ni, Co, Ag and Ge represents the content (mass %) in the alloy composition.

(4) A solder ball including the solder alloy according to any one of (1) to (3).

(5) A solder preform including the solder alloy according to any one of (1) to (3).

(6) A solder paste including the solder alloy according to any one of (1) to (3).

(7) A solder joint including the solder alloy according to any one of (1) to (3).

DETAILED DESCRIPTION OF THE INVENTION

Figure 1:
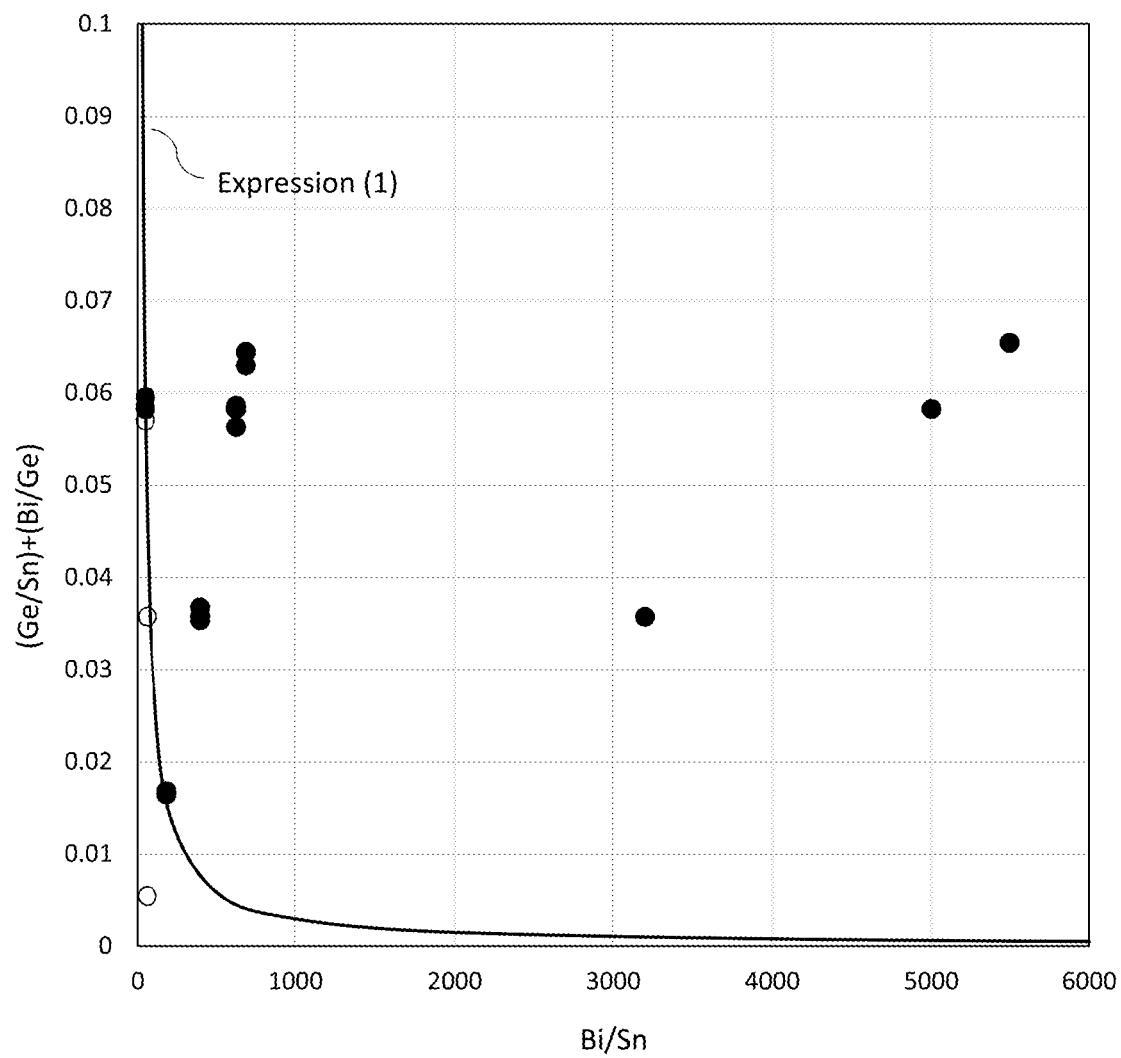
FIG. 1 is a diagram illustrating the relationship between the expression (1) in the solder alloy in the present invention and Examples.

The present invention is described in more detail below. In the present description, unless otherwise specified, "%" with respect to the solder alloy composition is "mass %".

1. Solder Alloy (1) Ag: From 3.2 to 3.8%

Ag is an element that improves the wettability of the solder alloy. If the Ag content is less than 3.2%, the effects above cannot be exerted. In terms of the lower limit, the Ag content is 3.2% or more, preferably 3.3% or more. On the other hand, if the Ag content exceeds 3.8%, the liquidus temperature of the solder alloy rises, and the wettability rather decreases. In terms of the upper limit, the Ag content is 3.8% or less, preferably 3.7% or less, more preferably 3.6% or less, still more preferably 3.5% or less.

(2) Cu: From 0.6 to 0.8%

Cu is an element that improves the fracture mode by increasing the bonding strength of the solder joint and enhances the wettability. If the Cu content is less than 0.6%, the effects above cannot be exerted. In terms of the lower limit, the Cu content is 0.6% or more, preferably 0.65% or more. On the other hand, if the Cu content exceeds 0.8%, a fracture mode appears at the bonding interface due to a decrease in the wettability. In addition, the wettability decreases due to a rise in the liquidus temperature. In terms of the upper limit, the Cu content is 0.8% or less, preferably 0.75% or less.

(3) Ni: From 0.01 to 0.2%

Ni is an element that inhibits the diffusion of Cu into Sn after soldering to prevent the growth of an intermetallic compound, and improves the fracture mode in a shear strength test because an intermetallic compound produced at the bonding interface becomes fine. If the Ni content is less than 0.01%, the effects above cannot be exerted. In terms of the lower limit, the Ni content is 0.01% or more, preferably 0.02% or more, more preferably 0.03% or more. On the other hand, if the Ni content exceeds 0.2%, the wettability decreases due to a rise in the liquidus temperature. In terms of the upper limit, the Ni content is 0.2% or less, preferably 0.1% or less, more preferably 0.07% or less, still more preferably 0.05% or less.

(4) Sb: From 2 to 5.5%

Sb is an element which forms a solid solution with the Sn phase and inhibits the growth of an intermetallic compound by preventing the diffusion of Cu from the electrode. If the Sb content is less than 2%, the effects above cannot be exerted. In terms of the lower limit, the Sb content is 2% or more, preferably 2.5% or more, more preferably 3.0% or more. On the other hand, if the Sb content exceeds 5.5%, the fracture mode shifts to the bonding interface, and the wettability decreases due to a rise in the liquidus temperature. In terms of the upper limit, the Sb content is 5.5% or less, preferably 5.0% or less.

(5) Bi: From 1.5 to 5.5%

Bi is an element that forms a solid solution in the Sn phase and inhibits the growth of an intermetallic compound by preventing the diffusion of Cu from the electrode. If the Bi content is less than 1.5%, the effects above cannot be exerted. In terms of the lower limit, the Bi content is 1.5% or more, preferably 2.5% or more, more preferably 3.2% or more. On the other hand, if the Bi content exceeds 5.5%, the fracture mode shifts to the bonding interface. In terms of the upper limit, the Bi content is 5.5% or less, preferably 5.0% or less.

(6) Co: From 0.001 to 0.1%

Co is an element that inhibits the diffusion of Cu into Sn after soldering, prevents the growth of an intermetallic compound and improves the fracture mode in a shear strength test because an intermetallic compound produced at the bonding interface becomes fine. If the Co content is less than 0.001%, the effects above cannot be exerted. In terms of the lower limit, the Co content is 0.001% or more, preferably 0.005% or more, more preferably 0.008% or more. On the other hand, if the Co content exceeds 0.1%, the intermetallic compound layer at the bonding interface becomes thick and therefore, the fracture mode shifts to the bonding interface. In addition, since the liquidus temperature rises, the wettability decreases. In terms of the upper limit, the Co content is 0.1% or less, preferably 0.05% or less, more preferably 0.01% or less.

(7) Ge: From 0.001 to 0.1%

Ge is an element that prevents the missing in soldering. If the Ge content is less than 0.001%, the effects above cannot be exerted. In terms of the lower limit, the Ge content is 0.001% or more, preferably 0.005% or more, more preferably 0.007% or more. On the other hand, if the Ge content exceeds 0.1%, the fracture mode shifts to the bonding interface, and the wettability decreases. In terms of the upper limit, the Ge content is 0.1% or less, preferably 0.05% or less, more preferably 0.010% or less.

(8) Relationship (1)

$$2.93 \leq \{(Ge/Sn)+(Bi/Ge)\} \times (Bi/Sn) \quad (1)$$

In the relationship (1), each of Sn, Ge, and Bi represents the content (mass %) in the alloy composition. Furthermore, the right side of the relationship (1), i.e. $\{(Ge/Sn)+(Bi/Ge)\} \times (Bi/Sn)$, may be referred to as "the expression (1)" hereinafter.

The solder alloy in the present invention must satisfy the relationship (1). Even if the contents of the above-described constituent elements are within respective ranges, unless the relationship (1) is satisfied, a missing occurs.

The missing is prevented by modifying the outermost surface of the solder alloy into a dense structure. Although each of Sn, Bi, and Ge thickens on the outermost surface of the solder alloy, a mere thickening of such an element on the outermost surface of the solder alloy does not lead to the modification of the outermost surface, and the missing cannot be prevented. The reason why in a case where the relationship (1) is satisfied, the outermost surface of the solder alloy can be modified and the missing can be prevented is not clear, but it is presumed as follows.

Each of the pair of Bi and Ge and the pair of Sn and Ge deposits a peritectic, and the pair of Sn and Bi deposits a twin crystal. Here, Ge is present with a concentration gradient decreasing from the outermost surface of Sn forming a solid solution with Bi toward the inside. Although a peritectic should be deposited from the pair of Ge and Sn and the pair of Bi and Ge, in a case where Ge is present with a concentration gradient as described above in Sn forming a solid solution with Bi, a twin crystal is deposited on the outermost surface of Sn, and a large number of crystal grain boundaries are formed. As a result, the outermost surface of the solder alloy is presumed to be modified into a dense structure such that the missing is prevented. More specifically, in the relationship (1), as long as the balance between the combination of elements capable of depositing a peritectic and the combination of elements depositing a twin crystal is within a predetermined range, the outermost surface of the solder alloy is modified into a dense structure.

In terms of the lower limit, the expression (1) needs to be 2.93 or more from the viewpoint of modifying the outermost surface of the solder alloy into a dense structure to prevent the missing. In terms of the lower limit, the expression (1) is preferably 2.968 or more, more preferably 3.037 or more, still more preferably 3.079 or more, yet still more preferably 3.148 or more, even yet still more preferably $1.412 \times 10$ or more, and most preferably $1.427 \times 10$ or more. The upper limit of the expression (1) is not particularly limited, and as long as each constituent element is within the above-described range, the effects of the present invention can be exerted without any problem. In terms of the upper limit, the expression (1) is preferably $3.597 \times 10^2$ or less, more preferably $2.912 \times 10^2$ or less, still more preferably $1.142 \times 10^2$ or less, yet still more preferably $4.431 \times 10$ or less, even yet still more preferably $4.329 \times 10$ or less, most preferably $3.662 \times 10$ or less.

In the present invention, each constituent element falls within the range above and satisfies the relationship (1), such that not only the missing can be prevented but also excellent wettability/spreadability, inhibition of the growth of an intermetallic compound at the bonding interface and optimization of the fracture mode after a shear strength test can be achieved.

(9) Balance: Sn

The balance of the solder alloy in the present invention is Sn. In addition to the above-described elements, unavoidable impurities may be contained. Even in a case of containing an unavoidable impurity, the effects above are not affected. Furthermore, as described later, even in a case where an element that is preferably not contained in the present invention is contained as an unavoidable impurity, the above-described effect is not affected.

(10) Optional Element

The solder alloy in the present invention may contain, in addition to those described above, 0.1% or less of at least one of Mg, Ti, Cr, Mn, Fe, Ga, Zr, Nb, Pd, Pt, Au, La and Ce in total. Even in a case where these elements are contained in an amount of 0.1% or less in total, the solder alloy in the present invention can exert the above-described effects of the present invention.

The total of the contents of these elements is preferably 0.1% or less, more preferably 0.09% or less, still more preferably 0.05% or less, yet still more preferably 0.03% or less, and most preferably 0.02% or less. The content of each element is not particularly limited, but in order to sufficiently bring out the above-described effects, the content of Mg is preferably from 0.0003 to 0.02%.

The content of Ti is preferably from 0.005 to 0.03%. The content of Cr is preferably from 0.002 to 0.03%. The content of Mn is preferably from 0.001 to 0.02%. The content of Fe is preferably from 0.005 to 0.02%. The content of Ga is preferably from 0.005 to 0.09%. The content of Zr is preferably from 0.001 to 0.01%.

The content of Nb is preferably from 0.003 to 0.006%. The content of Pd is preferably from 0.002 to 0.05%. The content of Pt is preferably from 0.002 to 0.05%. The content of Au is preferably from 0.006 to 0.09%, and the content of La is preferably from 0.001 to 0.02%. The content of Ce is preferably from 0.004 to 0.006%.

(11) Relationship (2)

$$0.001 < (Ni/Co) \times (1/Ag) \times Ge < 0.15 \quad (2)$$

In the relationship (2), each of Ni, Co, Ag and Ge represents the content (mass %) in the alloy composition. Furthermore, the center of the relationship (2), i.e. $(Ni/Co) \times (1/Ag) \times Ge$, may be referred to as "the expression (2)" hereinafter.

The solder alloy in the present invention preferably satisfies the relationship (2). In a case where the relationship (2) is satisfied, the balance of contents of Ni, Co, Ag and Ge is optimized such that the improvement of wettability, inhibition of the growth of an intermetallic compound layer at the bonding interface, and optimization of the fracture mode can be intended.

In soldering to Cu electrode, $Cu_6Sn_5$ is formed at the bonding interface. In a case where the solder contains Ni, Ni forms solid solution with $Cu_6Sn_5$ formed at the bonding interface to form $(Cu,Ni)_6Sn_5$. Because of this phenomenon, the crystal structure is distorted and Cu is prevented from diffusing from Cu layer to the solder alloy.

Furthermore, Ge and Co form solid solution with Ni of $(Cu,Ni)_6Sn_5$ formed at the bonding interface to further distort the crystal structure, thereby preventing the movement of Cu in the compound. Thus, Cu is prevented from diffusing from Cu layer to the solder alloy, and the growth of an intermetallic compound layer is more prevented than in conventional solder alloys.

In addition to this, in a case where the contents of Ag and Co are appropriate, the wettability is improved, and the strength of the solder alloy is adjusted to prevent the fracture at the bonding interface, thereby optimizing the fracture mode. While the strength of the solder alloy is improved by the formation of $Ag_3Sn$ due to Ag and the refinement of alloy structure due to Co, in a case where Ag, Co and the like are contained in good balance, the strength of the solder alloy is adjusted such that the fracture mode is not shifted to the bonding interface. Due to the nature of alloys, the deposited amount of $Ag_3Sn$ of the solder alloy in the present invention may be dependent directly or indirectly on the balance of these elements in addition to the content of Ag within the range described above.

As described above, in a case where the solder alloy in the present invention has the content of each constituent element within the range described above and satisfies not only the relationship (1) but also the relationship (2), the improvement of wettability, inhibition of the growth of an intermetallic compound layer at the bonding interface, and optimization of the fracture mode can be intended. In particular, the growth of an intermetallic compound can be sufficiently prevented.

In terms of the lower limit, the expression (2) is preferably more than 0.001, more preferably 0.00118 or more, 0.00147 or more, 0.00235 or more, 0.00294 or more, 0.00500 or more, 0.00700 or more, 0.00941 or more.

In terms of the upper limit, the expression (2) is preferably less than 0.15, more preferably 0.14706 or less, 0.11765 or less, 0.09412 or less, 0.05822 or less, 0.04706 or less, 0.0176 or less.

(12) In

The solder alloy in the present invention does preferably not contain In. If In is contained, there is a fear that the wettability is reduced and a fracture occurs in the vicinity of the bonding interface after a shear strength test.

2. Solder Ball

The solder alloy in the present invention can be used as a solder ball. The solder ball in the present invention can be used for bump formation of an electrode or substrate of a semiconductor package such as a BGA (ball grid array). The diameter of the solder ball in the present invention is preferably from 1 µm to 1,000 µm. The solder ball can be manufactured by a typical method for manufacturing a solder ball.

3. Solder Preform

The solder preform in the present invention can be used in the form such as a plate, a ring shape, a cylindrical shape or a line solder wound one or more turns.

4. Solder Paste

The solder alloy in the present invention can be used as a solder paste. The solder paste is obtained by mixing a solder alloy powder with a small amount of flux to form a paste. The solder alloy in the present invention may be utilized as a solder paste for mounting an electronic component on a printed circuit board by a reflow soldering method. The flux used for the solder paste may be either a water-soluble flux or a water-insoluble flux. A rosin flux that is a rosin-based water-insoluble flux is typically used.

5. Solder Joint

The solder joint in the present invention establishes a connection between an IC chip and a substrate (interposer) of a semiconductor package or establishes a connection by bonding a semiconductor package to a printed wiring board. More specifically, the solder joint in the present invention refers to a connection portion of an electrode and can be formed using typical soldering conditions.

EXAMPLES

Solder alloys having the alloy compositions shown in Table 1 and Table 2 were prepared and evaluated for the missing, wet spreading, growth of an intermetallic compound after soldering, and a fracture mode after a shear strength test.

Missing

First, a solder ball having a diameter of 0.6 mm was manufactured from each of the solder alloys above. The manufactured solder ball was left in a constant temperature bath (manufactured by ESPEC CORP.: PHH-101M) maintained at 150° C. for 168 hours. The solder ball after leaving was soldered to a substrate having a thickness of 1.2 mm and an electrode size of 0.5 mm in diameter (Cu-OSP). The number of solder balls soldered was 5.

As for the soldering conditions, a flux (manufactured by SENJU METAL INDUSTRY CO., LTD.: WF-6400) was applied onto an electrode, and soldering was performed using a reflow apparatus (manufactured by SENJU METAL INDUSTRY CO., LTD.: SNR-615) under a reflow profile with a peak temperature of 245° C. and a cooling rate of 2° C./s. After the reflow, the number of missings which were not soldered was visually confirmed.

The rating was "A" in a case where the number of missings is 0, and otherwise, the rating was "C".

Wet Spreading

A sample punched out from each of the solder alloys above to a dimension of 2 mm×2 mm×0.15 mm was manufactured. A flux (manufactured by SENJU METAL INDUSTRY CO., LTD.: WF-6400) was applied to an OSP-treated Cu plate material, and the punched-out sample was mounted thereon and soldered.

As for the soldering conditions, soldering was performed using a reflow apparatus (manufactured by SENJU METAL INDUSTRY CO., LTD.: SNR-615) under a reflow profile with a peak temperature of 245° C. and a cooling rate of 2° C./s. After the reflow, the wet/spread area was measured using a digital microscope (manufactured by Keyence Corporation: VHX-6000).

The rating was "A" in a case where the wet/spread area is 6 mm$^2$ or more, and was "C" in a case where it is less than 6 mm$^2$.

Growth of Intermetallic Compound after Soldering

A sample punched out from each of the solder alloys above to a dimension of 5 mm×5 mm×0.15 mm was manufactured. A flux (manufactured by SENJU METAL INDUSTRY CO., LTD.: WF-6400) was applied to an OSP-treated Cu plate material, and the punched-out sample was mounted thereon and soldered.

As for the soldering conditions, soldering was conducted using a reflow apparatus (manufactured by SENJU METAL INDUSTRY CO., LTD.: SNR-615) under a reflow profile with a peak temperature of 245° C. and a cooling rate of 2° C./s. The sample after the reflow was left in a constant temperature bath (manufactured by ESPEC CORP.: PHH-101M) maintained at 150° C. for 235 hours.

The sample after the heat treatment was observed in cross section by using a field emission scanning electron microscope (manufactured by JEOL Ltd.: JSM-7000F). The observation portion was an intermetallic compound layer formed at the bonding interface with the Cu plate. An image obtained by the cross-sectional observation was analyzed using an image analysis software (manufactured by Seika Corporation Co., Ltd.: Scandium), and the thickness of the intermetallic compound layer was measured.

The rating was "AA" in a case where the thickness of the intermetallic compound layer is 3.4 μm or less, was "A" in a case where it is more than 3.4 μm and 3.6 μm or less, and was "C" in a case where it exceeds 3.6 μm.

Fracture Mode after Shear Strength Test

First, a solder ball having a diameter of 0.6 mm was manufactured in the same manner as in the missing evaluation. The solder ball was soldered to a substrate having a substrate thickness of 1.2 mm and an electrode size of 0.5 mm in diameter (Cu-OSP).

As for the soldering conditions, a flux (manufactured by SENJU METAL INDUSTRY CO., LTD.: WF-6400) was applied onto an electrode, and soldering was conducted using a reflow apparatus (manufactured by SENJU METAL INDUSTRY CO., LTD.: SNR-615) under a reflow profile with a peak temperature of 245° C. and a cooling rate of 2° C./s. The manufactured sample was subjected to a shear strength test under the conditions of a shear rate of 1,000 mm/s in a shear strength measuring device (manufactured by Nordson Dage: SERIES 4000HS). The sample after the shear strength test was observed using a digital microscope (manufactured by Keyence Corporation: VHX-6000) to determine the fracture mode.

The rating was "A" in a case where a fracture is observed in the solder alloy, and was "C" in a case where a fracture is observed in the intermetallic compound layer formed at the bonding interface.

The evaluation results are shown in Table 1 and Table 2.

TABLE 1

| | Solder Composition (mass %) | | | | | | | | | Expression (1) | Expression (2) | Missing | Wet spreading | Growth of IMC After Soldering | Fracture Mode After Shear Test |
|---|---|---|---|---|---|---|---|---|---|---|---|---|---|---|---|
| | Sn | Ag | Cu | Sb | Bi | Ni | Co | Ge | In Others | | | | | | |
| Example 1 | bal. | 3.4 | 0.7 | 3.0 | 3.2 | 0.04 | 0.01 | 0.008 | | 1.428E+01 | 0.00941 | A | A | AA | A |
| Example 2 | bal. | 3.4 | 0.7 | 2.0 | 3.2 | 0.04 | 0.01 | 0.008 | | 1.412E+01 | 0.00941 | A | A | AA | A |
| Example 3 | bal. | 3.4 | 0.7 | 5.5 | 3.2 | 0.04 | 0.01 | 0.008 | | 1.469E+01 | 0.00941 | A | A | AA | A |
| Example 4 | bal. | 3.4 | 0.7 | 3.0 | 1.5 | 0.04 | 0.01 | 0.008 | | 3.079E+00 | 0.00941 | A | A | AA | A |
| Example 5 | bal. | 3.4 | 0.7 | 3.0 | 5.5 | 0.04 | 0.01 | 0.008 | | 4.329E+01 | 0.00941 | A | A | AA | A |
| Example 6 | bal. | 3.4 | 0.7 | 3.0 | 3.2 | 0.01 | 0.01 | 0.008 | | 1.427E+01 | 0.00235 | A | A | AA | A |
| Example 7 | bal. | 3.4 | 0.7 | 3.0 | 3.2 | 0.2 | 0.01 | 0.008 | | 1.430E+01 | 0.04706 | A | A | AA | A |
| Example 8 | bal. | 3.4 | 0.7 | 3.0 | 3.2 | 0.04 | 0.001 | 0.008 | | 1.428E+01 | 0.09412 | A | A | AA | A |
| Example 9 | bal. | 3.4 | 0.7 | 3.0 | 3.2 | 0.04 | 0.1 | 0.008 | | 1.429E+01 | 0.00094 | A | A | A | A |
| Example 10 | bal. | 3.4 | 0.7 | 3.0 | 3.2 | 0.04 | 0.01 | 0.001 | | 1.142E+02 | 0.00118 | A | A | AA | A |
| Example 11 | bal. | 3.4 | 0.7 | 3.0 | 5.1 | 0.04 | 0.01 | 0.1 | | 2.968E+00 | 0.11765 | A | A | AA | A |
| Example 12 | bal. | 3.4 | 0.7 | 5.0 | 5.0 | 0.04 | 0.008 | 0.008 | | 3.640E+01 | 0.01176 | A | A | AA | A |
| Example 13 | bal. | 3.4 | 0.7 | 2.0 | 5.0 | 0.04 | 0.008 | 0.008 | | 3.517E+01 | 0.01176 | A | A | AA | A |
| Example 14 | bal. | 3.4 | 0.7 | 5.5 | 5.0 | 0.04 | 0.008 | 0.008 | | 3.662E+01 | 0.01176 | A | A | AA | A |
| Example 15 | bal. | 3.4 | 0.7 | 5.0 | 1.5 | 0.04 | 0.008 | 0.008 | | 3.148E+00 | 0.01176 | A | A | AA | A |
| Example 16 | bal. | 3.4 | 0.7 | 5.0 | 5.5 | 0.04 | 0.008 | 0.008 | | 4.431E+01 | 0.01176 | A | A | AA | A |
| Example 17 | bal. | 3.4 | 0.7 | 5.0 | 5.0 | 0.01 | 0.008 | 0.008 | | 3.639E+01 | 0.00294 | A | A | AA | A |
| Example 18 | bal. | 3.4 | 0.7 | 5.0 | 5.0 | 0.2 | 0.008 | 0.008 | | 3.647E+01 | 0.05882 | A | A | AA | A |
| Example 19 | bal. | 3.4 | 0.7 | 5.0 | 5.0 | 0.04 | 0.001 | 0.008 | | 3.640E+01 | 0.09412 | A | A | AA | A |
| Example 20 | bal. | 3.4 | 0.7 | 5.0 | 5.0 | 0.04 | 0.1 | 0.008 | | 3.644E+01 | 0.00094 | A | A | A | A |
| Example 21 | bal. | 3.4 | 0.7 | 5.0 | 5.0 | 0.04 | 0.008 | 0.001 | | 2.912E+02 | 0.00147 | A | A | AA | A |
| Example 22 | bal. | 3.4 | 0.7 | 5.0 | 5.1 | 0.04 | 0.008 | 0.1 | | 3.037E+00 | 0.14706 | A | A | AA | A |
| Example 23 | bal. | 3.8 | 0.8 | 5.5 | 5.5 | 0.2 | 0.1 | 0.001 | | 3.597E+02 | 0.00053 | A | A | A | A |

TABLE 1-continued

| | Solder Composition (mass %) | | | | | | | | | Expression (1) | Expression (2) | Missing | Wet spreading | Growth of IMC After Soldering | Fracture Mode After Shear Test |
|---|---|---|---|---|---|---|---|---|---|---|---|---|---|---|---|
| | Sn | Ag | Cu | Sb | Bi | Ni | Co | Ge | In | Others | | | | | | |
| Example 24 | bal. | 3.4 | 0.7 | 3.0 | 3.2 | 0.04 | 0.01 | 0.008 | | Mg: 0.02 | 1.428E+01 | 0.00941 | A | A | AA | A |
| Example 25 | bal. | 3.4 | 0.7 | 3.0 | 3.2 | 0.04 | 0.01 | 0.008 | | Ti: 0.003 | 1.428E+01 | 0.00941 | A | A | AA | A |
| Example 26 | bal. | 3.4 | 0.7 | 3.0 | 3.2 | 0.04 | 0.01 | 0.008 | | Cr: 0.03 | 1.428E+01 | 0.00941 | A | A | AA | A |
| Example 27 | bal. | 3.4 | 0.7 | 3.0 | 3.2 | 0.04 | 0.01 | 0.008 | | Mn: 0.02 | 1.428E+01 | 0.00941 | A | A | AA | A |
| Example 28 | bal. | 3.4 | 0.7 | 3.0 | 3.2 | 0.04 | 0.01 | 0.008 | | Fe: 0.02 | 1.428E+01 | 0.00941 | A | A | AA | A |
| Example 29 | bal. | 3.4 | 0.7 | 3.0 | 3.2 | 0.04 | 0.01 | 0.008 | | Ga: 0.09 | 1.429E+01 | 0.00941 | A | A | AA | A |
| Example 30 | bal. | 3.4 | 0.7 | 3.0 | 3.2 | 0.04 | 0.01 | 0.008 | | Zr: 0.01 | 1.428E+01 | 0.00941 | A | A | AA | A |
| Example 31 | bal. | 3.4 | 0.7 | 3.0 | 3.2 | 0.04 | 0.01 | 0.008 | | Nb: 0.006 | 1.428E+01 | 0.00941 | A | A | AA | A |
| Example 32 | bal. | 3.4 | 0.7 | 3.0 | 3.2 | 0.04 | 0.01 | 0.008 | | Pd: 0.05 | 1.429E+01 | 0.00941 | A | A | AA | A |
| Example 33 | bal. | 3.4 | 0.7 | 3.0 | 3.2 | 0.04 | 0.01 | 0.008 | | Pt: 0.05 | 1.429E+01 | 0.00941 | A | A | AA | A |
| Example 34 | bal. | 3.4 | 0.7 | 3.0 | 3.2 | 0.04 | 0.01 | 0.008 | | Au: 0.09 | 1.429E+01 | 0.00941 | A | A | AA | A |
| Example 35 | bal. | 3.4 | 0.7 | 3.0 | 3.2 | 0.04 | 0.01 | 0.008 | | La: 0.02 | 1.428E+01 | 0.00941 | A | A | AA | A |
| Example 36 | bal. | 3.4 | 0.7 | 3.0 | 3.2 | 0.04 | 0.01 | 0.008 | | Ce: 0.006 | 1.428E+01 | 0.00941 | A | A | AA | A |

TABLE 2

| | Solder Composition (mass %) | | | | | | | | | | Expression (1) | Expression (2) | Missing | Wet spreading | Growth of IMC After Soldering | Fracture Mode After Shear Test |
|---|---|---|---|---|---|---|---|---|---|---|---|---|---|---|---|---|
| | Sn | Ag | Cu | Sb | Bi | Ni | Co | Ge | In | Others | | | | | | |
| Example 37 | bal. | 3.4 | 0.7 | 3.0 | 3.2 | 0.04 | 0.01 | 0.008 | | Mg: 0.0003, Ti: 0.0005, Cr: 0.0024, Mn: 0.017, Fe: 0.01, Ga: 0.0005, Zr: 0.0019, Nb: 0.0003, Pd: 0.0025, Pt: 0.0026, Au: 0.0068, La: 0.0016, Ce: 0.0004 | 1.429E+01 | 0.00941 | A | A | AA | A |
| Comp. Ex. 1 | bal. | 3.4 | 0.7 | 1.0 | 3.2 | 0.04 | 0.01 | 0.008 | | | 1.397E+01 | 0.00941 | A | A | C | A |
| Comp. Ex. 2 | bal. | 3.4 | 0.7 | 7.0 | 3.2 | 0.04 | 0.01 | 0.008 | | | 1.495E+01 | 0.00941 | A | C | AA | C |
| Comp. Ex. 3 | bal. | 3.4 | 0.7 | 3.0 | 0.5 | 0.04 | 0.01 | 0.008 | | | 3.384E−01 | 0.00941 | C | A | C | A |
| Comp. Ex. 4 | bal. | 3.4 | 0.7 | 3.0 | 7.0 | 0.04 | 0.01 | 0.008 | | | 7.135E+01 | 0.00941 | A | A | AA | C |
| Comp. Ex. 5 | bal. | 3.4 | 0.7 | 3.0 | 3.2 | 0.005 | 0.01 | 0.008 | | | 1.427E+01 | 0.00118 | A | A | C | C |
| Comp. Ex. 6 | bal. | 3.4 | 0.7 | 3.0 | 3.2 | 0.3 | 0.01 | 0.008 | | | 1.432E+01 | 0.07059 | A | C | AA | A |
| Comp. Ex. 7 | bal. | 3.4 | 0.7 | 3.0 | 3.2 | 0.04 | 0.2 | 0.008 | | | 1.431E+01 | 0.00047 | A | C | A | C |
| Comp. Ex. 8 | bal. | 3.4 | 0.7 | 3.0 | 3.2 | 0.04 | 0.01 | 0.0005 | | | 2.284E+02 | 0.00059 | C | A | A | A |
| Comp. Ex. 9 | bal. | 3.4 | 0.7 | 3.0 | 5.4 | 0.04 | 0.01 | 0.11 | | | 3.035E+00 | 0.12941 | A | C | AA | C |
| Comp. Ex. 10 | bal. | 3.4 | 0.7 | 3.0 | 3.2 | 0.04 | 0.01 | 0.05 | | | 2.286E+00 | 0.05882 | C | A | AA | A |
| Comp. Ex. 11 | bal. | 3.5 | 0.7 | 5.0 | 5.0 | 0.1 | 0.005 | 0.1 | 0.1 | | 2.924E+00 | 0.57143 | C | C | A | C |
| Comp. Ex. 12 | bal. | 3.4 | 0.7 | 3.0 | 5.0 | 0.04 | 0.01 | 0.1 | | | 2.849E+00 | 0.11765 | C | A | AA | A |
| Comp. Ex. 13 | bal. | 3.5 | 0.7 | 5.0 | 5.0 | 0.1 | 0.005 | 0.1 | | | 2.921E+00 | 0.57143 | C | A | A | A |

The underline indicates that the value is out of the range of the present invention.

As apparent from Table 1 and Table 2, all of Examples 1 to 37 where the constituent elements are within the scope of the present invention and satisfy the relationship (1), showed the results that a missing does not occur, excellent wet spreading is exhibited, the growth of an intermetallic compound after soldering is inhibited, and the fracture mode after the shear strength test is appropriate. Further, it is understood that since Examples other than Examples 9, 20 and 23 also satisfy the relationship (2), the growth of IMC is sufficiently inhibited even after soldering.

On the other hand, in Comparative Example 1 where the Sb content is small, an intermetallic compound grew after soldering. In Comparative Example 2 where the Sb content is large, the wet spreading was poor and at the same time, a fracture in the vicinity of the bonding interface was confirmed after the shear strength test.

In Comparative Example 3 where the Bi content is small and the relationship (1) is not satisfied, a missing occurred, and an intermetallic compound grew after soldering. In Comparative Example 4 where the Bi content is large, a fracture in the vicinity of the bonding interface was confirmed after the shear strength test.

In Comparative Example 5 where the Ni content is small, an intermetallic compound grew after soldering and at the same time, a fracture in the vicinity of the bonding interface was confirmed after the shear strength test. In Comparative Example 6 where the Ni content is large, wet spreading was poor.

In Comparative Example 7 where the Co content is large, wet spreading was poor and at the same time, a fracture in the vicinity of the bonding interface was confirmed after the shear strength test.

In Comparative Example 8 where the Ge content is small, a missing occurred. In Comparative Example 9 where the Ge content is large, wet spreading was poor and at the same time, a fracture in the vicinity of the bonding interface was confirmed after the shear strength test.

In Comparative Examples 10, 12 and 13 where the relationship (1) is not satisfied, a missing occurred. In Comparative Example 11 where the relationship (1) is not satisfied and In is contained, a missing occurred, wet spreading was poor, and a fracture in the vicinity of the bonding interface was confirmed after the shear strength test.

Figure 2:
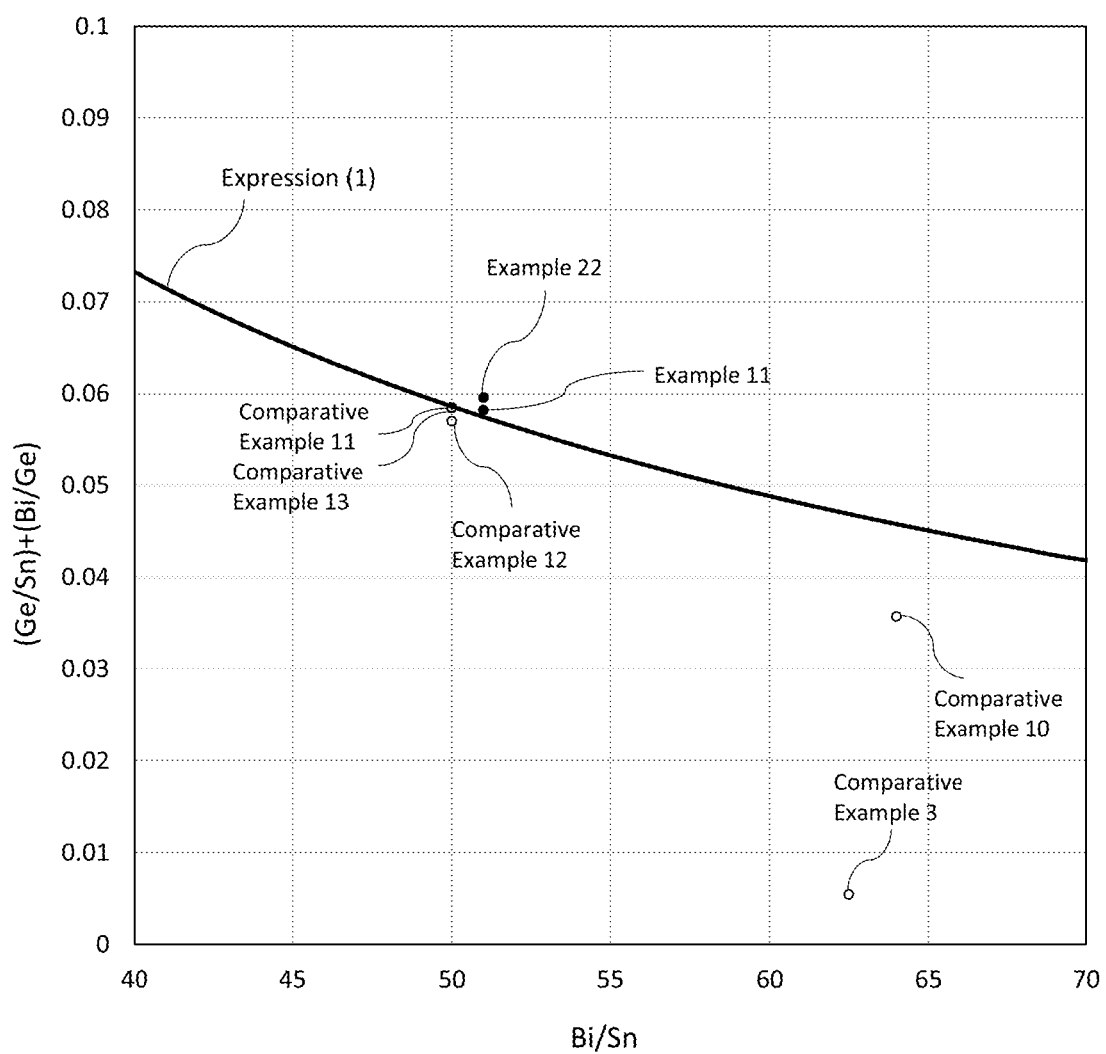
FIG. 2 is an enlarged diagram of FIG. 1 indicating the range of from 40 to 70 in the abscissa of FIG. 1.

The relationship (1) is further described by referring to FIG. 1 and FIG. 2 obtained from the results in Table 1 and Table 2. FIG. 1 is a diagram illustrating the relationship between the expression (1) in the solder alloy in the present invention and Examples. FIG. 2 is an enlarged diagram of FIG. 1 indicating the range of from 40 to 70 in the abscissa of FIG. 1. In FIG. 1, a solid line represents the value of the expression (1), a "black circle" represents Examples 1 to 37, and a "white circle" represents Comparative Examples 3 and 10 to 13. In addition, in FIG. 2, a solid line represents the value of the expression (1), each filled circle represents Example 11 and Example 22, and each open circle represents Comparative Examples 3 and 10 to 13.

As apparent from both figures, it was revealed that Comparative Examples present in the region surrounded by (Bi/Sn) axis, ((Ge/Sn)+(Bi/Ge)) axis and the line indicating the expression (1) do not satisfy the relationship (1) and therefore, a missing occurred in these Comparative Examples. In particular, as apparent from FIG. 2, it is seen that in Comparative Example 13, the relationship (1) is not satisfied and therefore a missing occurred, though the requirements for each constituent element of the present invention are satisfied. Accordingly, it is understood from FIG. 1 and FIG. 2 that in a case where the relationship (1) is satisfied, at least the missing can be prevented.

While the present invention has been described in detail and with reference to specific embodiments thereof, it will be apparent to one skilled in the art that various changes and modifications can be made therein without departing from the spirit and scope thereof.

The invention claimed is:

1. A solder alloy having an alloy composition consisting of, in mass%:
   from 3.2 to 3.8% of Ag;
   from 0.6 to 0.8% of Cu;
   from 0.01 to 0.2% of Ni;
   from 2 to 5.5% of Sb;
   from 1.5 to 5.5% of Bi;
   from 0.001 to 0.1% of Co;
   from 0.001 to 0.1% of Ge;
   from 0 to 0.1%;
   from 0 to 0.1% of Ti;
   from 0 to 0.1% of Cr;
   from 0 to 0.1% of Mn;
   from 0 to 0.01% of Fe;
   from 0 to 0.1% of Ga;
   from 0 to 0.1% of Zr;
   from 0 to 0.1% of Nb;
   from 0 to 0.1% of Pd;
   from 0 to 0.1% of Pt;
   from 0 to 0.1% of Au;
   from 0 to 0.1% of La;
   from 0 to 0.1% of Ce; and
   the balance being Sn,
   wherein the sum of Mg, Ti, Cr, Mn, Fe, Ga, Zr, Nb, Pd, Pt, Au, La and Ce is 0.1% or less,
   wherein the alloy composition satisfies the following relationship (1):

$$2.93 \leq \{(Ge/Sn)+(Bi/Ge)\} \times (Bi/Sn) \tag{1}$$

wherein in the relationship (1), each of Sn, Ge, and Bi represents the content (mass %) in the alloy composition.

2. The solder alloy according to claim 1, wherein at least one of Mg, Ti, Cr, Mn, Fe, Ga, Zr, Nb, Pd, Pt, Au, La and Ce is present in the alloy composition.

3. The solder alloy according to claim 1, wherein the alloy composition further satisfies the following relationship (2):

$$0.001 < (Ni/Co) \times (1/Ag) \times Ge < 0.15 \tag{2}$$

wherein in the relationship (2), each of Ni, Co, Ag and Ge represents the content (mass %) in the alloy composition.

4. A solder ball comprising the solder alloy according to claim 1.

5. A solder preform comprising the solder alloy according to claim 1.

6. A solder paste comprising the solder alloy according to claim 1.

7. A solder joint comprising the solder alloy according to claim 1.

8. The solder alloy according to claim 1, wherein the alloy composition is free from Fe.

9. A solder ball comprising the solder alloy according to claim 3.

10. A solder preform comprising the solder alloy according to claim 3.

11. A solder paste comprising the solder alloy according to claim 3.

12. A solder joint comprising the solder alloy according to claim 3.

13. A solder alloy having an alloy composition consisting of, in mass %:
   from 3.2 to 3.8% of Ag;
   from 0.6 to 0.8% of Cu;
   from 0.01 to 0.2% of Ni;
   from 2 to 5.5% of Sb;
   from 3.2% to 5.5% of Bi;
   from 0.001 to 0.1% of Co;
   from 0.001 to 0.1% of Ge; and
   optionally at least one of Mg, Ti, Cr, Mn, Fe, Ga, Zr, Nb, Pd, Pt, Au, La and Ce: 0.1% or less in total, with the balance being Sn,
   wherein the alloy composition satisfies the following relationship (1):

$$2.93 \leq \{(Ge/Sn)+(Bi/Ge)\} \times (Bi/Sn) \tag{1}$$

wherein in the relationship (1), each of Sn, Ge, and Bi represents the content (mass %) in the alloy composition.

\* \* \* \* \*